(12) United States Patent
Iwamoto et al.

(10) Patent No.: US 6,520,191 B1
(45) Date of Patent: Feb. 18, 2003

(54) CARRIER FOR CLEANING SILICON WAFERS

(75) Inventors: Yoshio Iwamoto, Utsunomiya (JP); Hiroyuki Kurokawa, Utsunomiya (JP)

(73) Assignee: MEMC Electronic Materials, Inc., St. Peters, MI (US)

(*) Notice: Subject to any disclaimer, the term of this patent is extended or adjusted under 35 U.S.C. 154(b) by 0 days.

(21) Appl. No.: 09/807,907
(22) PCT Filed: Oct. 15, 1999
(86) PCT No.: PCT/US99/24203
§ 371 (c)(1), (2), (4) Date: Jun. 8, 2001
(87) PCT Pub. No.: WO00/24041
PCT Pub. Date: Apr. 27, 2000

(30) Foreign Application Priority Data

Oct. 19, 1998 (JP) .................................. 10-297290

(51) Int. Cl.$^7$ .................................................. B08B 3/12
(52) U.S. Cl. ............... 134/184; 206/454; 206/711; 211/41.18; 134/902
(58) Field of Search .................. 134/902, 1.3, 184, 134/186; 118/500; 211/41.18; 206/707, 711, 454

(56) References Cited

U.S. PATENT DOCUMENTS

| | | | |
|---|---|---|---|
| 3,926,305 A | | 12/1975 | Wallestad |
| 3,961,877 A | | 6/1976 | Johnson |
| 4,256,229 A | * | 3/1981 | Lee .................. 211/41.18 |
| 4,318,749 A | | 3/1982 | Mayer |
| 4,355,974 A | * | 10/1982 | Lee .................. 118/500 X |
| 4,471,716 A | | 9/1984 | Milliren |
| 4,493,418 A | | 1/1985 | Johnson |
| 4,653,636 A | * | 3/1987 | Armstrong ............. 206/454 X |
| 4,669,612 A | | 6/1987 | Mortensen |
| 4,949,848 A | | 8/1990 | Kos |
| 4,981,222 A | | 1/1991 | Lee |
| 5,111,936 A | | 5/1992 | Kos |
| 5,131,546 A | | 7/1992 | Kodera |
| 5,154,301 A | | 10/1992 | Kos |
| 5,476,176 A | | 12/1995 | Gregerson et al. |
| 5,715,851 A | | 2/1998 | Jung et al. |
| 5,782,362 A | | 7/1998 | Ohori |
| 5,863,334 A | * | 1/1999 | Chou et al. ............ 118/500 |

FOREIGN PATENT DOCUMENTS

| | | |
|---|---|---|
| EP | 0 856 873 A2 | 8/1998 |
| GB | 2 291 740 A | 1/1996 |
| JP | 03022547 | 1/1991 |
| TW | 82109753 | 1/1995 |
| WO | WO97/39475 | 10/1997 |

* cited by examiner

Primary Examiner—Philip Coe
(74) Attorney, Agent, or Firm—Senniger, Powers, Leavitt & Roedel

(57) ABSTRACT

A carrier for receiving and holding a plurality of semiconductor wafers and permitting surfaces of the wafers to receive maximum exposure to ultrasonic waves during a wafer cleaning process in which the carrier and the wafers are immersed in a liquid medium and ultrasonic waves are generated in the liquid medium. The carrier includes two vertical sidewalls and at least three horizontal supporting rods that interconnect the sidewalls and that are collectively positioned for supporting wafers in generally upright, face to face position generally parallel to each other. At least one stabilizing rod extends horizontally between the sidewalls for limiting wafer motion relative to the carrier to steady the wafers. A series of spaced apart teeth on the stabilizing rod define troughs for receiving wafers loosely therein to prevent substantial vibratory deflections of the wafers.

15 Claims, 5 Drawing Sheets

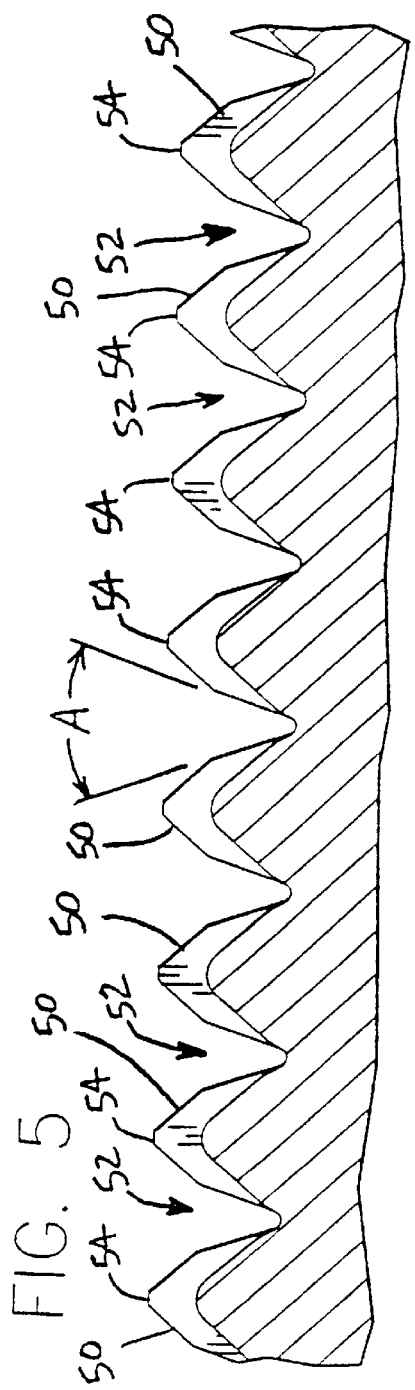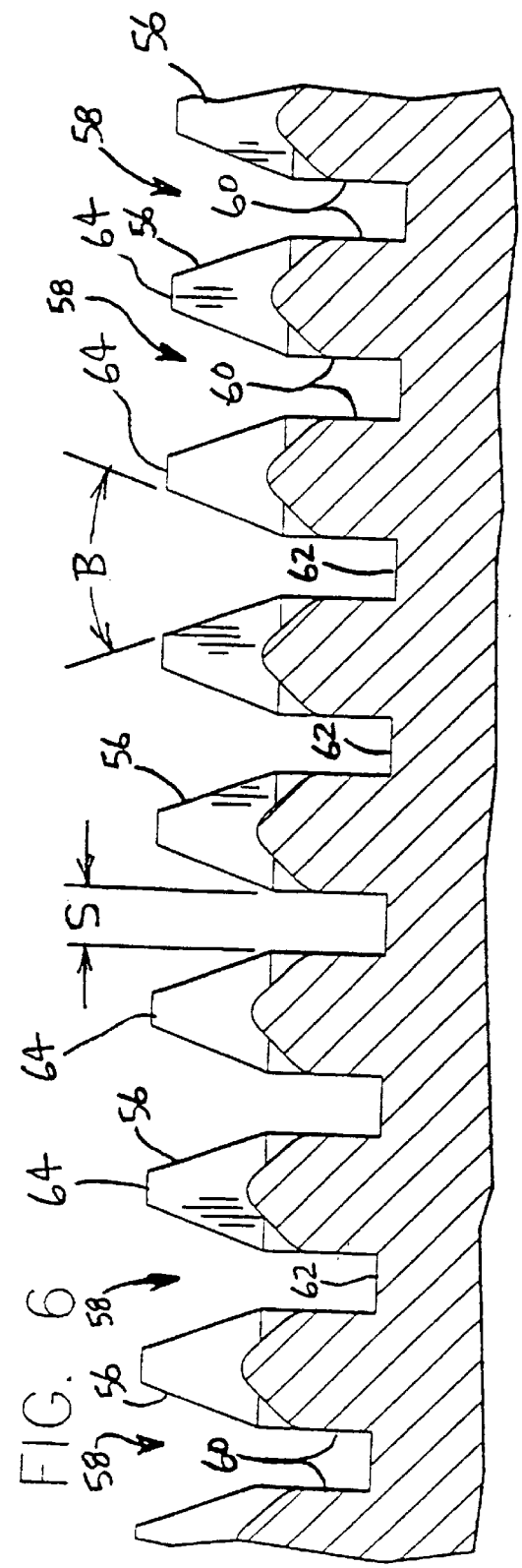

CARRIER FOR CLEANING SILICON WAFERS

BACKGROUND OF THE INVENTION

This invention relates generally to semiconductor wafer cleaning, and in particular to a carrier for holding a plurality of wafers while maximizing exposure to ultrasonic waves.

Semiconductor wafers for the microelectronics industry are produced by first slicing thin wafers from a silicon crystal ingot. After slicing, the wafers undergo a lapping process to give them a somewhat uniform thickness. The wafers are then etched to remove damage and produce a smooth surface. The final step is polishing the wafers to produce a highly reflective and damage-free surface on at least one face of each wafer. The wafers must be cleaned between the lapping and etching steps to remove contaminants such as lapping grit. If the cleaning process is not effective, the surfaces of the wafer will be stained with fine lapping grit residue. Such residual grit may cause contamination problems during electrical device fabrication.

Cleaning of silicon wafers is frequently done by exposing the wafers to ultrasonic waves while they are immersed in a liquid medium. First, each wafer is placed in a cassette or carrier that receives multiple wafers and holds them upright in a parallel, spaced arrangement. The carrier with the wafers is placed into a cleaning tank where it is immersed in a fluid containing a caustic solution, with or without a surfactant to assist in wetting and dispersing dirt. Ultrasonic waves emanating from wave generators located at the bottom of the cleaning tank are introduced into the liquid medium. Particles of grit or other contaminants on the wafer surfaces are removed by exposure to ultrasonic waves. The carrier is then put into a rinse tank where the wafers are rinsed with deionized water, and finally the wafers are dried with isopropanol vapor.

The carrier must limit vibratory motion of the wafers to prevent the occurrence of damage. When the carrier is moved, as for example when it is placed into the cleaning tank, the wafers can jostle in the carrier or against each other, forming chips or cracks. To prevent such breakage, carriers of the prior art have sometimes had a large structure designed for holding wafers in a secure manner. Some of these carriers have multiple slots for receiving and holding peripheral edge regions of wafers. Each slot extends along a substantial portion of the wafer circumference, as from a position near a bottom upwardly to as high as the upper $\frac{1}{3}$ of the wafer.

A significant problem in the cleaning process is that carriers obstruct portions of wafers from being adequately exposed to ultrasonic waves. The carriers of the prior art have a somewhat bulky structure for supporting the wafers in the slots. The structure blocks or hinders dispersion of ultrasonic waves throughout the liquid medium, thereby preventing the waves from reaching all areas of the wafers with sufficient strength to clean. In particular, upper portions of wafer surfaces are often cleaned inadequately and retain some detrimental particle contamination because the waves are blocked before they reach the upper part of the tank. Therefore, the wafers are cleaned unevenly. Further, the structure of the carrier prevents even drying of the wafer surfaces. Peripheral edge regions of the wafers that are received in slots are not fully dried during the isopropanol drying process, causing water marks and degraded wafer quality.

SUMMARY OF THE INVENTION

Among the several objects and features of the present invention may be noted the provision of a carrier for receiving and holding a plurality of semiconductor wafers; the provision of such a carrier for permitting all portions of wafer surfaces to be adequately cleaned during an ultrasonic wave irradiation cleaning process; the provision of such a carrier that prevents wafer damage when the carrier is moved or vibrated; the provision of such a carrier that permits even drying of wafer surfaces; and the provision of such a carrier that is easy to use.

Briefly, a carrier of the present invention receives and holds a plurality of semiconductor wafers and permits surfaces of the wafers to receive maximum exposure to ultrasonic wave irradiation during a wafer cleaning process in which the carrier and the wafers are immersed in a liquid medium and ultrasonic waves are generated in the liquid medium. The carrier is adapted to hold wafers having a size defined by a wafer diameter. The carrier comprises spaced apart sidewalls and horizontal rods collectively positioned for supporting wafers in generally upright, face to face position generally parallel to each other. Each of the rods extends between and interconnects the sidewalls, the rods being positioned in spaced relationship relative to each other so that wafers are exposed to the liquid medium and ultrasonic waves between the rods. The sidewalls are oriented so that the carrier is adapted to hold wafers generally parallel to the sidewalls. The sidewalls are sized to have a maximum height that is less than about half of the wafer diameter so that an upper half of each wafer is exposed to the liquid medium when the carrier holding the wafers is immersed in the liquid medium, whereby the carrier is adapted to hold wafers to permit generally unobstructed passage of ultrasonic waves through the liquid medium to reach all portions of wafer surfaces with minimal impedance by structure of the carrier, thereby facilitating effective cleaning.

In another aspect, a carrier of the present invention receives and holds a plurality of semiconductor wafers and permitting surfaces of the wafers to receive maximum exposure to ultrasonic waves during a wafer cleaning process in which the carrier and the wafers are immersed in a liquid medium and ultrasonic waves are generated in the liquid medium. The carrier is adapted to hold wafers having a size defined by a wafer diameter. The carrier comprises two vertical sidewalls in spaced relationship and at least three horizontal rods positioned in spaced relation for support of wafers in generally parallel relationship with respect to each other. Each of the rods extends between the sidewalls. A series of spaced apart teeth are on at least one of the rods. Each adjacent pair of teeth define a channel therebetween having a shape generally in the form of a "V" to receive a peripheral edge portion of the wafer for holding the wafer in spaced apart position relative to other wafers in the carrier.

Other objects and features of the present invention will be in part apparent and in part pointed out hereinafter.

BRIEF DESCRIPTION OF THE DRAWINGS

FIG. 5 is a view in section taken in the plane of line 5—5 of FIG. 1; and

FIG. 6 is a view in section taken in the plane of line 6—6 of FIG. 1.

DETAILED DESCRIPTION OF THE PREFERRED EMBODIMENT

Figure 1:
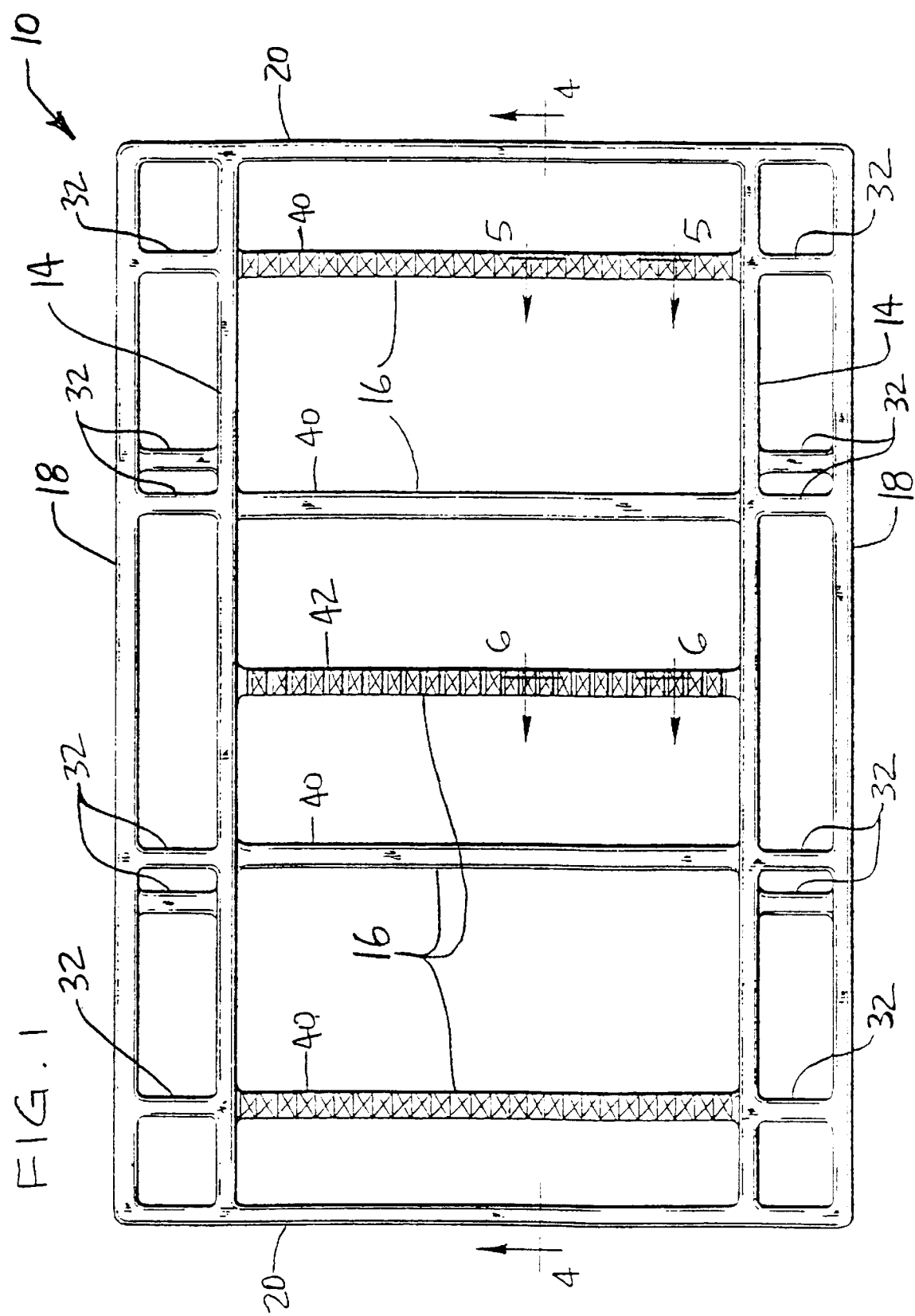
FIG. 1 is a top plan view of a carrier for cleaning silicon wafers of the present invention.
Figure 4:
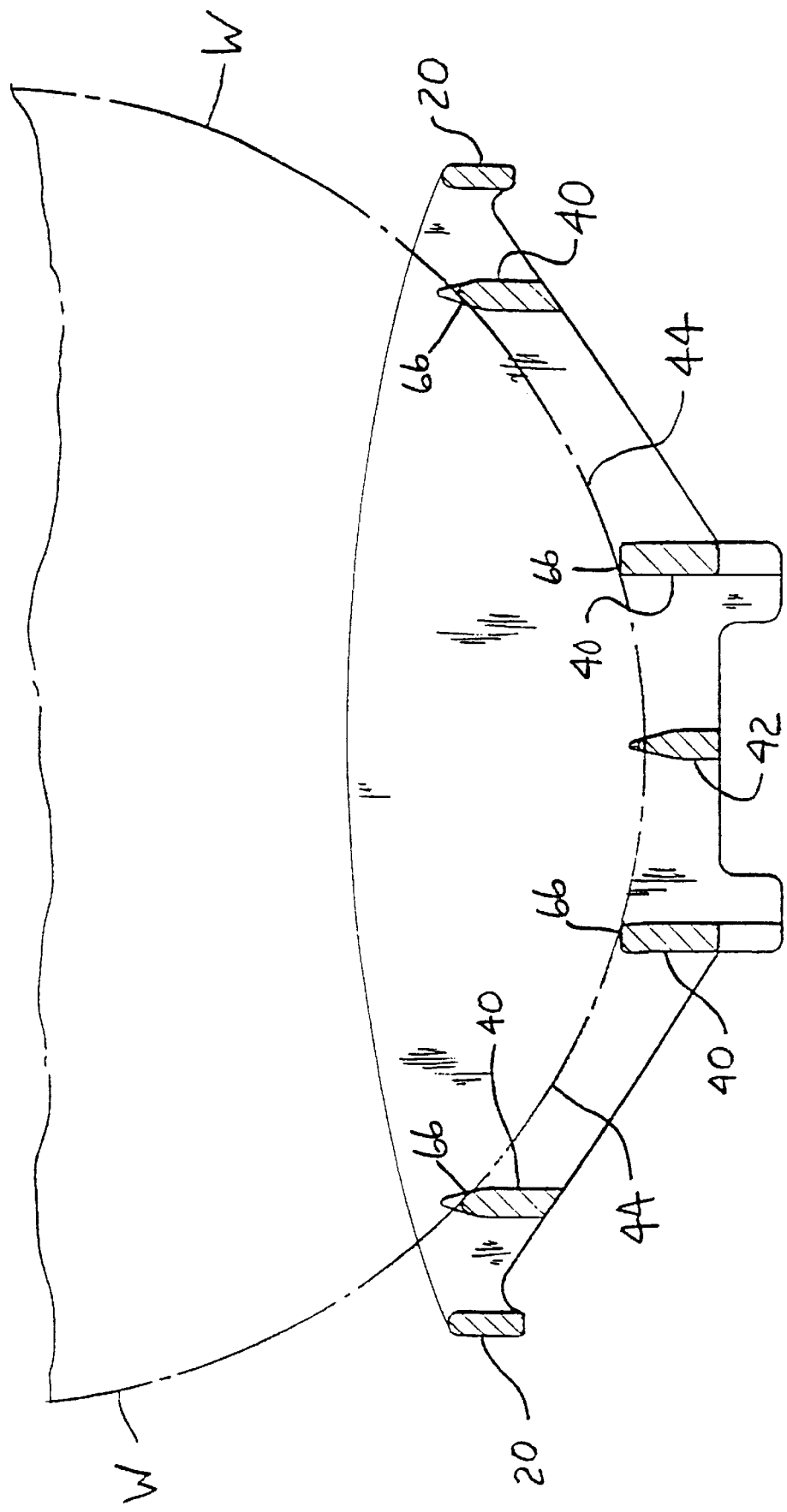
FIG. 4 is a view in section taken in the plane of line 4—4 of FIG. 1, with a wafer held by the carrier being shown in phantom.

Referring now to the drawings and in particular to FIGS. 1 and 4, a carrier for receiving and holding a plurality of semiconductor wafers is indicated generally at 10. The carrier 10 permits surfaces of the wafers W to receive maximum exposure to ultrasonic waves during a wafer cleaning process in which the carrier and the wafers are immersed in a liquid medium inside a cleaning tank and ultrasonic waves are generated into the liquid medium.

The carrier 10 comprises a frame with two parallel, spaced apart sidewalls 14 and several horizontal rods 16 extending between the sidewalls and oriented perpendicularly to the sidewalls. External walls 18 are spaced outside the sidewalls 14 and are parallel to the sidewalls, with one external wall associated with each sidewall. Two end members 20 are spaced outside the horizontal rods 16 and are parallel to the rods, positioned at laterally opposite ends of the carrier. In plan view as shown in FIG. 1, the external walls 18 and end members 20 define the periphery of the carrier structure. All members of the carrier 10 have generally rounded corners.

Figure 2:
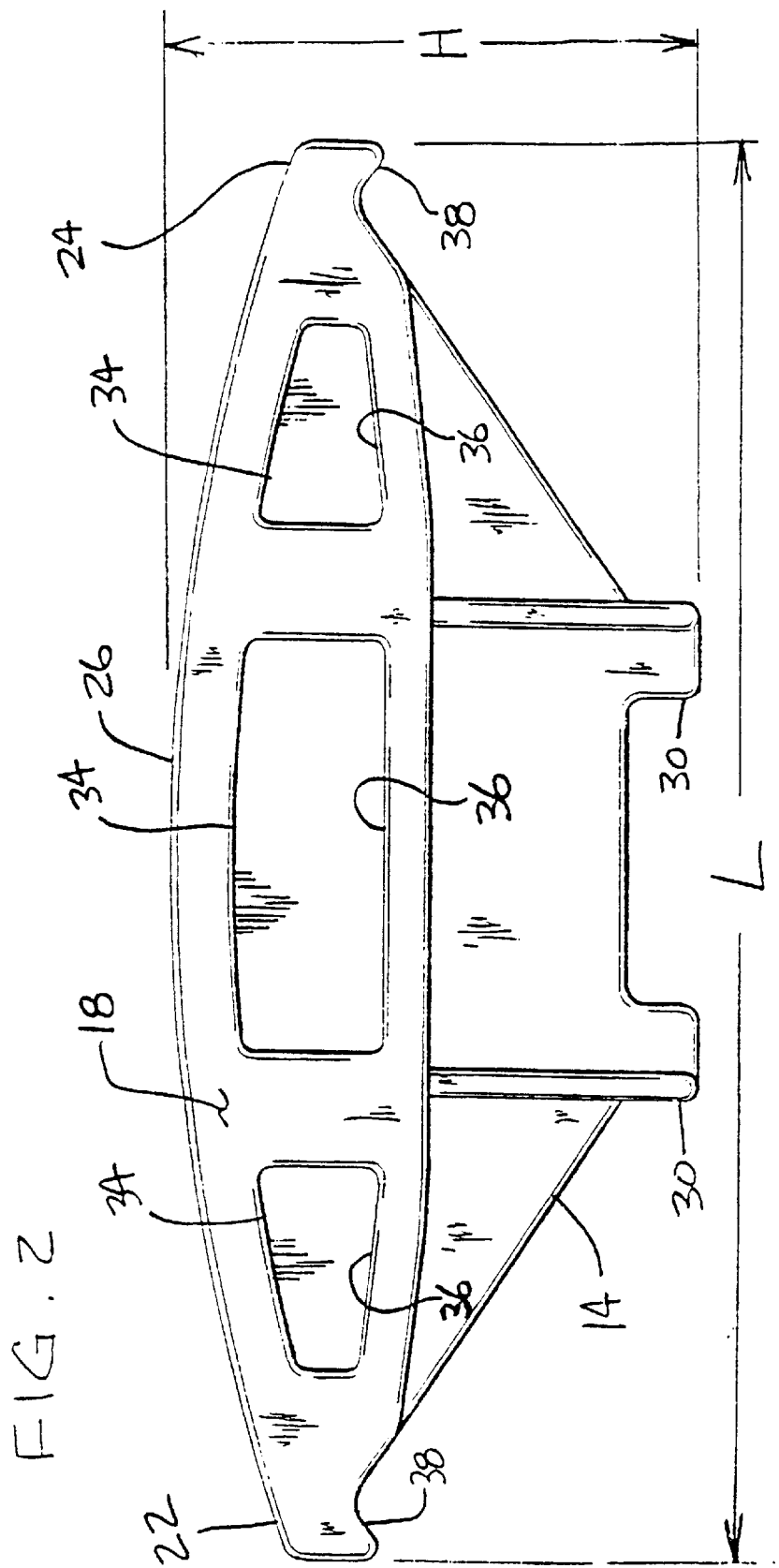
FIG. 2 is a side elevational view of the carrier.

Each sidewall 14 has a maximum height generally in a middle of the sidewall and tapers in height toward ends 22, 24 of the sidewall, as shown in FIG. 2. In the preferred embodiment, an upper edge 26 of each sidewall has a gentle convex shape that resembles an inverted hull of a boat. The shape provides an efficient support for the structure of the carrier that is both strong and small in surface area. The two sidewalls 14 have generally the same shape and size.

The maximum height H of each sidewall 14, which defines the height of the carrier, is sized to range between ¼ and ½ of a diameter of the wafers W that are intended to be held by the carrier. In practice, sidewalls within that height range have demonstrated good carrier stability while retaining generally small surface area. The relatively small surface area in comparison to carriers of the prior art ensures that an upper half of each wafer is exposed to the liquid medium when the carrier holding the wafers is immersed in the liquid medium. The carrier 10 permits generally unobstructed passage of ultrasonic waves through the liquid medium to reach all portions of wafer surfaces with minimal impedance by structure of the carrier, thereby to facilitate effective cleaning.

The length L of each sidewall 14 is sized to be slightly smaller than a diameter of the wafers W held by the carrier. In the preferred embodiment, the sidewall length is at least 90% of the wafer diameter and more preferably 94%. If the sidewall were significantly shorter than 90% diameter, the carrier could be unstable, and if it were longer than 100% diameter, the carrier is unnecessarily heavy.

The carrier 10 has four legs 30 for supporting the carrier on an underlying surface and providing stability. Two legs extend from a bottom of each sidewall 14 and have equal lengths for supporting the carrier in a level orientation. The legs 30 are symmetrically arranged about a center of the carrier.

Figure 3:
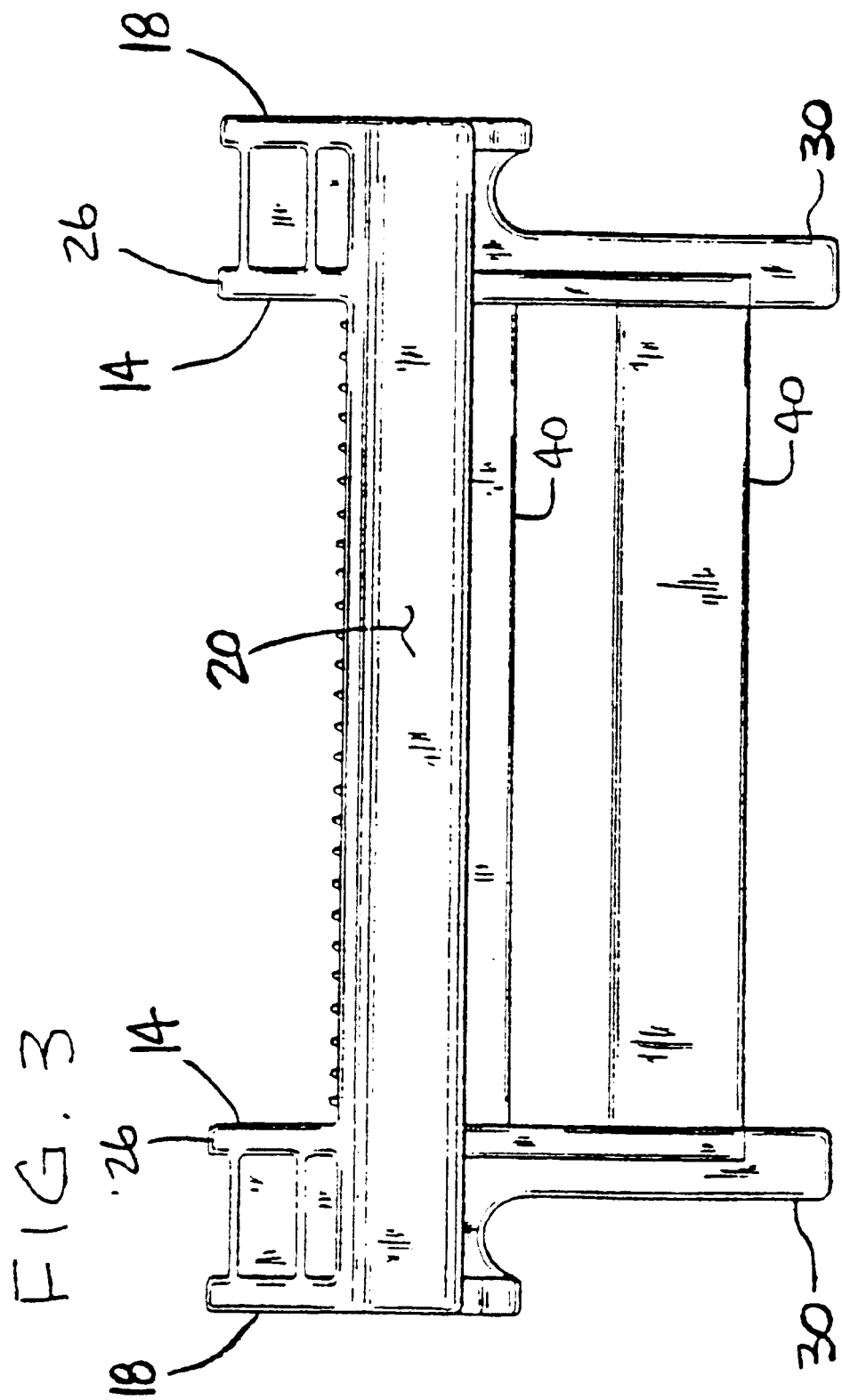
FIG. 3 is an end elevational view of the carrier.

The external walls 18 are aligned parallel to the sidewalls 14 along generally an upper half of the carrier, as seen in FIGS. 2 and 3. The external walls 18 are spaced outside the sidewalls 14 and are attached to the sidewalls by spacer ribs 32. Each external wall 18 has three openings 34 therein to minimize weight of the carrier, each opening having a simple shape that blends with the carrier contours and allows-for economical manufacture. In the preferred embodiment, the openings reduce the area of each external wall 18 between 35% and 55%.

An edge periphery 36 of each opening 34 is shaped so that there are no flat, level surfaces along the periphery where liquid could collect and inhibit complete drying. Instead, the edge periphery 36 is tapered in profile toward a direction away from the carrier so that liquid will flow off the edge, with an angle of taper being between 15° and 60°, and preferably between 30° and 45°. Other surfaces on the carrier 10, including a top edge periphery of each external wall 18 and of each sidewall 14, are similarly sloped to inhibit collection or pooling of liquid.

End members 20 extend between the sidewalls 14 and form handles for manually lifting the carrier or for being gripped and supported by a robot end effector. The end members 20 have rounded bottoms for easy gripping and are hollow to lighten the weight of the carrier. Each sidewall 14 includes a lip 38 located near each end member, as shown in FIG. 2, so that a robot end effector will not slip off the sidewall or end member when lifting the carrier.

The horizontal rods 16 include four supporting rods 40 for holding and supporting the weight of the wafers and a fifth rod, comprising a stabilizing rod 42, as described below. The four supporting rods 40 hold wafers W in generally upright, face to face position with the wafers parallel to each other. Each of the horizontal rods 16 10 extends between and interconnects the sidewalls 14, and may have a shape of a cylinder or square pillar or the like. The rods 16 are positioned in spaced relationship relative to each other so that during a wafer cleaning process, the wafers are exposed to ultrasonic waves that are generated in a bottom of the cleaning tank and propagate between the rods. The rods are preferably sized in length so that the carrier can hold between 20 and 30 of the wafers W. Rods of other sizes holding a greater or fewer number of wafers do not depart from the scope of this invention.

As shown in FIG. 4, the supporting rods 40 are collectively positioned in spaced relationship defining an arc 44 that corresponds to a segment of a curved peripheral edge on each wafer W. The rods engage wafers generally at point contacts along the peripheral edge. The arc 44 extends between the point of contact of the wafer W with the rod 40 farthest to the left in FIG. 4 and the point of contact of the wafer with the rod farthest to the right. The arc 44 intersects the other rods 40. The arc 44 defined by the rods corresponds to the segment that comprises at least about ⅖, and preferably ⅖, of an entire circumference of a wafer W. Preferably, the supporting rods 40 define an arc of minimal extent needed to hold the wafers stable during handling and ultrasonic cleaning. The supporting rods 40 are shown in the drawings having a generally symmetrical arrangement with even spacing about the center of the carrier 10. Other positions of the rods, including non-symmetrical spacings, do not depart from the scope of this invention.

First and second rods of the supporting rods 40 extend between locations on each of the two sidewalls 14 near ends 22, 24. Third and fourth rods extend between locations on the sidewalls 14 spaced generally inwardly of the ends 22, 24. A series of spaced apart teeth 50 are located on at least one of the supporting rods 40. In the preferred embodiment, teeth 50 are located on the first and second rods, but the third and fourth rods are free of teeth. It is understood that other combinations are possible, such as only one rod having teeth or all rods. The series of teeth 50 extend along substantially an entire length of each supporting rod 40 which has teeth. It is understood that rods may have teeth on only a portion of the extent of the rod without departing from the scope of this invention.

Adjacent pairs of teeth 50 define V-shaped channels, indicated generally at 52 in FIG. 5, shaped for receiving peripheral edge portions of wafers. Each channel 52 is adapted to receive a peripheral edge portion of the wafer W for holding the wafer in spaced apart position relative to other wafers in the carrier. The teeth 50 have a generally conical slope or taper with a constant included angle A that is between 35° and 50°. A tip 54 of each tooth is preferably blunted so as to facilitate entry of a wafer into the channel 52 and inhibit damage to a silicon wafer that may inadvertently impact the tip.

The fifth horizontal rod comprises the stabilizing rod 42 to limit wafer motion relative to the carrier for steadying of any vibration of wafers and holding wafers in position. The stabilizing rod 42 is perpendicular to the sidewalls 14 and extends between locations near the center of each sidewall. It is understood that the stabilizing rod could be located anywhere along the carrier 10 without departing from the scope of the invention. The stabilizing rod 42 has a series of spaced apart teeth 56 defining Y-shaped troughs or channels, indicated generally at 58 in FIG. 6, between each two adjacent teeth for receiving peripheral edge portions of wafers. Each trough 58 is sized and shaped so that the wafer is loosely received therein. The teeth 56 on the stabilizing rod 42 have generally vertical edges 60 forming sides of the troughs, the sides of each trough being in parallel spaced relationship with a spacing S that exceeds a thickness of a wafer received therein. The sides of each trough are spaced so that S is preferably between about 10% and about 20% greater than a thickness of a wafer. Each wafer is suspended above a bottom 62 of the trough 58 and does not touch the teeth 56, unless vibrated or misaligned. The bottom 62 of the trough is flat, although it is not necessarily flat for proper functioning of the invention. Each trough 58 is shaped to permit the wafer therein to move in vibration between a nominal position in which the wafer is suspended in the trough and remains substantially free of any contact with the teeth 56 on the stabilizing rod 42, and a deflected position in which the wafer engages one tooth on the stabilizing rod at a side 60 of the trough to prevent further vibratory deflection of the wafer. The teeth 56 on the stabilizing rod have a generally conical slope or taper with a constant included angle B that is between 35° and 50°. A tip 64 of each tooth is preferably blunted so as to not damage a silicon wafer that may inadvertently impact the tip.

The carrier 10 is a one-piece molded plastic construction. The material is a resin that is essentially inert and resistant to effects of chemicals in the cleaning solution and to effects of high temperatures, thereby to preclude deterioration, warpage, or softening when exposed to chemicals and high temperatures. In the preferred embodiment, the carrier is made of a fluorine-based resin, such as PFA or PTFE, or another resin such as PEEK, or PBT.

In operation, a number of silicon wafers W are placed into the carrier 10 for cleaning to remove minute dust particles and lapping grit residue. Each wafer is inserted so that the edge simultaneously engages four contact points 66 (FIG. 4) corresponding to the supporting rods 40 to support the wafer. These include two points at the first and second rods where the wafer edge is engaged in V-shaped channels 52 of FIG. 5, and two points at the third and fourth rods which have no teeth and support the wafer at its edge. A small peripheral edge portion of each wafer is simultaneously received within one of the Y-shaped troughs 58 (FIG. 6) between adjacent teeth on the stabilizing rod 42, where the wafer is suspended above the bottom 62 of the trough. The carrier may be lifted by gripping the end members 20 either manually or by a robot end effector. The carrier is transported to a cleaning tank, and during transport any vibration of the wafers is limited by the teeth 56 on the stabilizing rod 42. The carrier with the wafers is immersed in a liquid medium, such as a chemical solution, within the cleaning tank and ultrasonic waves are generated, typically at the bottom of the tank. The sonic waves reach all portions of the wafer surfaces, with no blockage of the upper portions because the carrier 10 has a low-slung, minimal-bulk structure. The carrier and wafers are then rinsed with deionized water and dried with isopropanol vapor. Because the wafers are supported at point contacts rather than in slits as in some other carriers of the prior art, there are no locations where fluid collects and where drying is inhibited. Therefore, the carrier permits even drying and inhibits formation of water marks or the like on the wafer surfaces.

Thus, the carrier 10 receives and holds a plurality of semiconductor wafers and permits all portions of wafer surfaces to be adequately cleaned and evenly dried. The carrier prevents wafer damage when the carrier is moved or vibrated.

In view of the above, it will be seen that the several objects of the invention are achieved and other advantageous results obtained.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A carrier for receiving and holding a plurality of semiconductor wafers and permitting surfaces of the wafers to receive maximum exposure to ultrasonic waves during a wafer cleaning process in which the carrier and the wafers are immersed in a liquid medium and ultrasonic waves are generated in the liquid medium, the carrier being adapted to hold wafers having a size defined by a wafer diameter, the carrier comprising:

two vertical sidewalls in spaced relationship;

at least three horizontal supporting rods positioned in spaced relation for support of wafers in generally parallel relationship with respect to each other, each of the supporting rods extending between the sidewalls;

a series of spaced apart teeth on at least one of said supporting rods, each adjacent pair of teeth defining a channel therebetween having a shape generally in the form of a "V" to receive a peripheral edge portion of a wafer for holding the wafer in spaced apart position relative to other wafers in the carrier;

at least one stabilizing rod extending horizontally between the sidewalls to limit wafer motion relative to the carrier for steadying of wafers; and a series of spaced apart teeth on the stabilizing rod and troughs formed between each two adjacent teeth for receiving wafers, each trough being sized and shaped so that the wafer is loosely received therein to permit the wafer to move in vibration between a nominal position in which the wafer is supported by the supporting rods substantially free of any contact with the teeth on the stabilizing rod, and a deflected position in which the wafer engages one tooth on the stabilizing rod at a side of the trough to prevent further vibratory deflection of the wafer.

2. The carrier as set forth in claim 1 wherein the teeth on the stabilizing rod have generally vertical edges forming sides of said troughs, the sides of each trough being in parallel spaced relationship with a spacing that exceeds a thickness of a wafer received therein.

3. The carrier as set forth in claim 2 wherein the sides of each trough are spaced from between about 10% and about 20% greater than said thickness of water.

4. The carrier as set forth in claim 1 wherein said horizontal supporting rods are collectively positioned in spaced relationship defining an arc that corresponds to a segment of a curved peripheral edge on each wafer, the supporting rods being adapted for engaging wafers at points along the peripheral edge.

5. The carrier as set forth in claim 4 wherein there are at least four supporting rods including two rods having teeth, and two rods that are free of teeth.

6. A carrier as set forth in claim 1 wherein each sidewall has a maximum height generally in a middle of the sidewall and tapers in height toward laterally opposite ends of the sidewall.

7. A carrier as set forth in claim 1 wherein each sidewall is sized to have a maximum height that is less than about half of the wafer diameter.

8. The carrier as set forth in claim 7 wherein each sidewall has an upper peripheral edge defining a generally convex shape of the sidewall.

9. The carrier as set forth in claim 8 wherein said maximum height of each sidewall is between about ¼ and about ½ of the wafer diameter.

10. The carrier as set forth in claim 9 wherein the two sidewalls are generally aligned and have substantially the same size and shape.

11. The carrier as set forth in claim 1 wherein the carrier has at least some peripheral edge surfaces that are tapered in profile so that liquid will flow off the edge surfaces.

12. The carrier as set forth in claim 1 wherein a tip of each tooth is blunted thereby to inhibit damage to a wafer that may inadvertently impact the tip.

13. A carrier for receiving and holding a plurality of semiconductor wafers and permitting surfaces of the wafers to receive maximum exposure to ultrasonic wave irradiation during a wafer cleaning process in which the carrier and the wafers are immersed in a liquid medium and ultrasonic waves are generated in the liquid medium, the carrier being adapted to hold wafers having a size defined by a wafer diameter, the carrier comprising:

spaced apart sidewalls;

at least four horizontal rods collectively positioned for supporting wafers in generally upright, face to face position generally parallel to each other, each of the rods extending between and interconnecting the sidewalls, the rods being in spaced relationship defining an arc that corresponds to a segment of a curved peripheral edge on each wafer, the rods being adapted for engaging wafers at points along the peripheral edge, the rods further being positioned so that wafers are exposed to said liquid medium and ultrasonic waves between said rods; and a series of spaced apart teeth on two of said rods, with two of said rods being free of teeth;

wherein each adjacent pair of teeth is adapted to receive a peripheral edge portion of the wafer for holding the wafer in spaced apart position relative to other wafers in the carrier, the sidewalls being oriented so that the carrier is adapted to hold wafers generally parallel to the sidewalls, the sidewalls being sized to have a maximum height that is less than about half of the wafer diameter so that an upper half of each wafer is exposed to the liquid medium when the carrier holding said wafers is immersed in the liquid medium, whereby the carrier is adapted to hold wafers to permit generally unobstructed passage of ultrasonic waves through the liquid medium to reach all portions of wafer surfaces with minimal impedance by structure of the carrier, thereby facilitating effective cleaning.

14. The carrier as set forth in claim 13 wherein each sidewall has an upper peripheral edge defining a generally convex shape of the sidewall.

15. The carrier as set forth in claim 13 wherein a tip of each tooth is blunted thereby to inhibit damage to a wafer that may inadvertently impact the tip.

* * * * *

UNITED STATES PATENT AND TRADEMARK OFFICE
CERTIFICATE OF CORRECTION

PATENT NO. : 6,520,191 B1
DATED : February 18, 2003
INVENTOR(S) : Yoshio Iwamoto et al.

It is certified that error appears in the above-identified patent and that said Letters Patent is hereby corrected as shown below:

<u>Title page,</u>
Item [73], Assignee, "MEMC Electronic Materials, Inc., St. Peters, MI (US)" should read -- MEMC Electronic Materials, Inc., St. Peters, MO (US) --.

Signed and Sealed this

Twenty-fourth Day of June, 2003

JAMES E. ROGAN
*Director of the United States Patent and Trademark Office*